(12) United States Patent
Kim et al.

(10) Patent No.: US 8,987,756 B2
(45) Date of Patent: Mar. 24, 2015

(54) DIFFUSION TYPE LED APPARATUS UTILIZING DYE-SENSITIZED SOLAR CELLS

(75) Inventors: Jeong-Tai Kim, Seoul (KR); Won-Woo Kim, Gangwon-do (KR); Geun-Young Yun, Gyeonggi-do (KR)

(73) Assignee: University-Industry Cooperation Group Of Kyung Hee University, Seocheon-dong, Giheung-gu, Yongin-si, Gyeonggi-do (KR)

( * ) Notice: Subject to any disclaimer, the term of this patent is extended or adjusted under 35 U.S.C. 154(b) by 0 days.

(21) Appl. No.: 13/992,558

(22) PCT Filed: Dec. 29, 2010

(86) PCT No.: PCT/KR2010/009469
§ 371 (c)(1),
(2), (4) Date: Aug. 14, 2013

(87) PCT Pub. No.: WO2012/077850
PCT Pub. Date: Jun. 14, 2012

(65) Prior Publication Data
US 2013/0320360 A1  Dec. 5, 2013

(30) Foreign Application Priority Data
Dec. 7, 2010 (KR) .......................... 10-2010-0124454

(51) Int. Cl.
*H01L 27/15* (2006.01)
*H01L 31/147* (2006.01)
(Continued)

(52) U.S. Cl.
CPC ................. *H01L 31/147* (2013.01); *F21S 9/03* (2013.01); *F21S 9/037* (2013.01); *F21V 3/00* (2013.01); *F21V 15/011* (2013.01); *F21V 29/02* (2013.01); *F21V 29/2206* (2013.01);
(Continued)

(58) Field of Classification Search
CPC ........ F21S 9/037; F21V 29/02; F21V 29/025; F21V 29/027
USPC ............. 257/82, E33.056, E33.074, E33.075; 362/183
See application file for complete search history.

(56) References Cited

U.S. PATENT DOCUMENTS 8,172,435 B2 * 5/2012 Spiro et al. .................... 362/391
2001/0027806 A1 * 10/2001 Yamanaka et al. ............ 136/263

FOREIGN PATENT DOCUMENTS

KR 10-2006-0081160 A 7/2006
KR 10-2008-0026748 A 3/2008
(Continued)

OTHER PUBLICATIONS

International Search Report from PCT/KR2010/009469 dated Nov. 7, 2011, 2 pgs.

*Primary Examiner* — Tucker Wright
(74) *Attorney, Agent, or Firm* — Matthew I. Delulio; Abel Law Group, LLP

(57) ABSTRACT

An LED luminaire has a dye-sensitized solar cell for converting light emitted from a light source to electric energy and uses the converted electric energy. Since the dye-sensitized solar cell plays a role of a diffusion plate, the LED luminaire may diffuse light and convert wasted light into power. Further, since energy consumption and green-house gas generation decrease, it is possible to provide an environment-friendly LED luminaire. Moreover, if the power generated by the dye-sensitized solar cell is used for cooling the LED luminaire, it is possible to enhance heat dissipation efficiency of the LED luminaire.

18 Claims, 2 Drawing Sheets

(51) Int. Cl.
  *F21S 9/03*   (2006.01)
  *F21V 3/00*   (2006.01)
  *F21V 15/01*  (2006.01)
  *F21V 29/02*  (2006.01)
  *F21V 29/00*  (2006.01)
  *H01L 31/052* (2014.01)
  *H01L 31/053* (2014.01)
  *F21Y 105/00* (2006.01)
  *F21Y 101/02* (2006.01)

(52) U.S. Cl.
  CPC ....... *F21V 29/2293* (2013.01); *H01L 31/0521* (2013.01); *H01L 31/0586* (2013.01); *F21Y 2105/001* (2013.01); *F21Y 2101/02* (2013.01); *Y02B 10/10* (2013.01)

USPC .............. 257/82; 257/E33.074; 257/E33.075

(56) References Cited

FOREIGN PATENT DOCUMENTS

| KR | 10-0890650     | B1   | 3/2009  |            |
|----|----------------|------|---------|------------|
| KR | 10-2009-0095831| A    | 9/2009  |            |
| KR | 10-2009-0130473| A    | 12/2009 |            |
| KR | 10-2010-0006823| A    | 1/2010  |            |
| KR | 10-2010-0019624| A    | 2/2010  |            |
| WO | WO 2010141580  | A2 * | 12/2010 | ... F21S 9/03 |

* cited by examiner

DIFFUSION TYPE LED APPARATUS UTILIZING DYE-SENSITIZED SOLAR CELLS

CROSS-REFERENCE TO RELATED APPLICATIONS

The present application is a US national stage entry under 35 U.S.C. §371 of International Application No. PCT/KR2010/009469 filed Dec. 29, 2010, entitled "DIFFUSER TYPE LED LUMINAIRE USING DYE-SENSITIZED SOLAR CELL," by Jeong-Tai KIM et al., which claims priority under 35 U.S.C. §119(b) to KR Patent Application No. 10-2010-0124454, filed Dec. 7, 2010, entitled "DIFFUSER TYPE LED LUMINAIRE USING DYE-SENSITIZED SOLAR CELL," by Jeong-Tai KIM et al., which applications are incorporated by reference herein in their entirety.

TECHNICAL FIELD

The present disclosure relates to an LED luminaire, and more particularly to an LED luminaire using an environment-friendly dye-sensitized solar cell, which has a solar cell for converting light emitted from a light source to electric energy and uses the converted electric energy.

BACKGROUND ART

The present application claims priority to Korean Patent Application No. 10-2010-0124454 filed in the Republic of Korea on Dec. 7, 2010, the disclosures of which are incorporated herein by reference.

Generally, a light bulb has a short lifecycle, which may further shorten depending on its use time and therefore, may need to be periodically checked and exchanged, which will increase maintenance or exchange costs. However, an LED is advantageous in that it has a lower power consumption, semi-permanent lifecycle, rapid response rate, safety and environment-friendly property, in comparison to existing light sources such as fluorescent lights and incandescent lights. Therefore, many studies are being made to replace existing light sources with LEDs, which tend to substitute for general bulbs as a light source of a luminaire such as various kinds of indoor lamps, liquid crystal displays, electronic display boards, streetlamps or the like.

Since LED is generally weak against heat generated in operation, most LED luminaires use various methods for efficient heat dissipation. For example, Korean Unexamined Patent Publication No. 10-2009-0130473 discloses a power LED module for streetlamps, which emits heat through a heat dissipation plate or the like, and Korean Unexamined Patent Publication No. 10-2009-0095831 discloses a heat diffusion body having a heat diffusion fin or arranged doubly.

However, if natural cooling using a heat dissipation plate or a heat diffusion fin is applied, the heat dissipation efficiency deteriorates at an LED luminaire which is installed at the ceiling or in a narrow space. A method for emitting heat by forced cooling using a fan is also used in the art. However, this method requires a power source for driving the fan separately from the power source for the LED and consumes a lot of power.

Meanwhile, if a light source of the luminaire is a point light source, blinding may occur. Therefore, a diffusion plate may be used to convert the light point source into a surface light source.

However, if a diffusion plate is used in the luminaire, the intensity of light emitted out of the luminaire decreases, which deteriorates the light dissipation efficiency in comparison to the input power source.

DISCLOSURE

Technical Problem

The present disclosure is designed to solve the problems of the prior art, and therefore the present disclosure is directed to providing an LED luminaire, which may reduce wasted power by using a dye-sensitized solar cell as a diffusion plate.

The present disclosure is also directed to providing an LED luminaire, which may use a dye-sensitized solar cell as a diffusion plate and drive a cooling device with power generated by the dye-sensitized solar cell.

The present disclosure is also directed to providing an LED luminaire, which may use the power generated by a dye-sensitized solar cell serving as a diffusion plate as a portion of the power used for driving a light emitting unit.

The present disclosure is also directed to providing an LED luminaire, which may reduce energy consumption.

Technical Solution

In one aspect of the present disclosure, there is provided a light emitting diode (LED) luminaire, which includes a light emitting unit having at least one LED; a case for accommodating the light emitting unit; and a dye-sensitized solar cell installed below the light emitting unit and passing light irradiated from the light emitting unit.

Preferably, the dye-sensitized solar cell may diffuse light emitted from the light emitting unit.

Preferably, the light emitting unit may be driven by any one of powers applied from an external power source and the dye-sensitized solar cell.

Preferably, the LED luminaire may further include a fan driven by a current generated from the dye-sensitized solar cell and cooling heat generated by the operation of the light emitting unit.

Advantageous Effects

According to the present disclosure, since a dye-sensitized solar cell plays a role of a diffusion plate and converts light, which may be wasted when diffusing the light emitted from a luminaire, into electric power, the LED luminaire has very excellent power efficiency.

In addition, since the present disclosure uses the power generated through the dye-sensitized solar cell to drive a cooling device, the LED luminaire has excellent heat dissipation efficiency and therefore the LED luminaire has long lifecycle and improved reliability.

Moreover, since the present disclosure uses the power generated through the dye-sensitized solar cell as a portion of the power for driving a light emitting unit, the LED luminaire has very excellent power efficiency.

Further, according to the present disclosure, energy consumption and green-house gas generation decrease, thereby providing an environment-friendly LED luminaire.

BEST MODE

Figure 1:
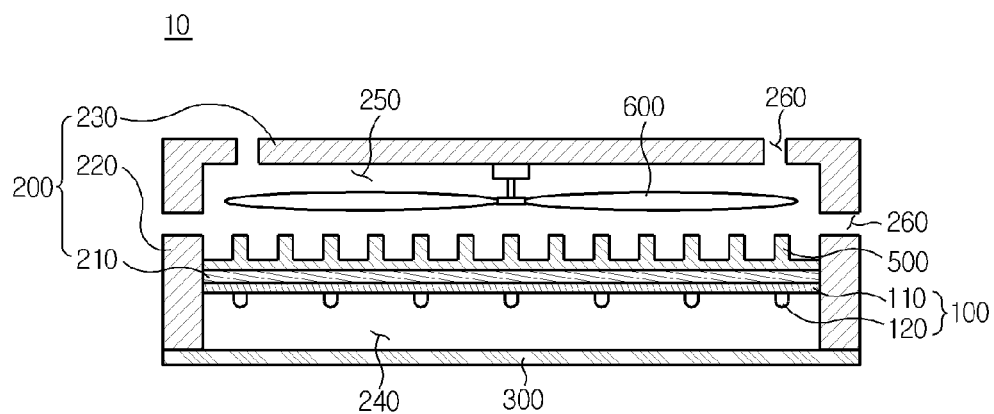
FIG. 1 is a cross-sectional view showing an LED luminaire according to a first embodiment of the present disclosure.

It should be understood that the terms used to indicate the direction in the description and claims which follow, such as 'upper', 'lower', 'right', 'left', 'front', and 'rear' are relative terms for depicting the direction viewed on the drawings, and that elements shown in the drawings are exaggerated, excluded or simplified for the convenience of understanding and clarity. Therefore, the size of each component may not fully reflect an actual size. Also, any explanation of the prior art known to relate to the present invention may be omitted if it is regarded to render the subject matter of the present invention vague.

First Embodiment

Figure 2:
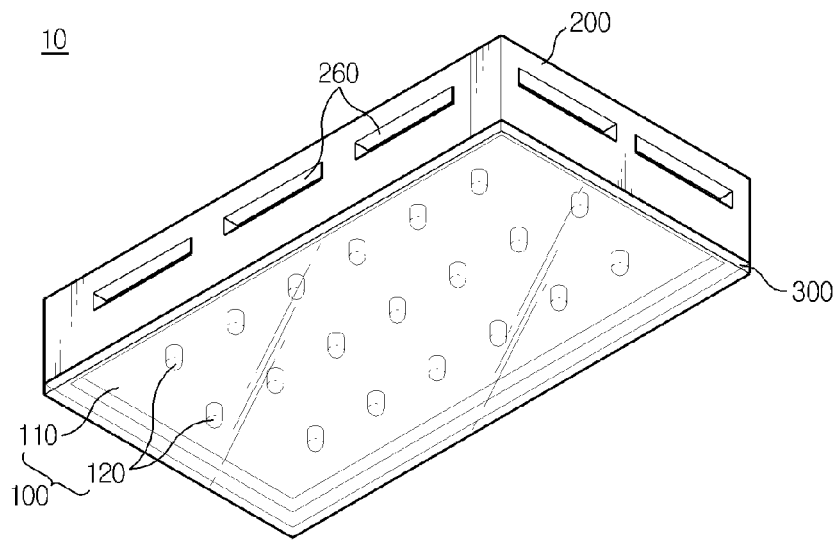
FIG. 2 is a perspective view showing the LED luminaire according to the first embodiment of the present disclosure.

FIG. 1 is a cross-sectional view showing an LED luminaire 10 according to a first embodiment of the present disclosure, and FIG. 2 is a perspective view showing the LED luminaire 10 according to the first embodiment of the present disclosure.

Referring to FIG. 1, the LED luminaire 10 according to the first embodiment includes a case 200, a light emitting unit 100, a dye-sensitized solar cell 300 and a fan 600.

The case 200 shown in FIG. 1 includes a bottom plate 210, a side plate 220 and a top plate 230. The side plate 220 extends downwards from an end of the top plate 230, the bottom plate 210 is spaced apart from the top plate 230 by a predetermined distance and disposed in contact with the inner side surface of the side plate 220. A space below the bottom plate 210 is called a first accommodation portion 240, and a space between the bottom plate 210 and the top plate 230 is called a second accommodation portion 250.

The first accommodation portion 240 accommodates the light emitting unit 100. The light emitting unit 100 includes a substrate 110 and at least one LED element 120 mounted to the substrate 110. The LED element 120 is generally arranged regularly as shown in FIG. 2.

The light emitting unit 100 is driven by at least one of powers applied from an external power source and the dye-sensitized solar cell 300. If the light emitting unit 100 has a plurality of LED elements 120, the power applied from the external power source and the dye-sensitized solar cell 300 may be supplied to the plurality of LED elements 120 in various ways.

For example, the external power source and the dye-sensitized solar cell 300 may be connected to the LED element 120 in parallel. In this case, a power source regulator (not shown) is preferably provided at the LED luminaire 10 to regulate a rated voltage and a rated current used by the light emitting unit 100 before the power from the external power source and the dye-sensitized solar cell 300 is supplied to the light emitting unit 100.

As another example, it is also possible that some LED elements 120 (hereinafter, referred to as a group A) is supplied with power only from the dye-sensitized solar cell 300, and the other LED elements 120 (hereinafter, referred to as a group B) is supplied with power from the external power source.

As still another example, the group A may be supplied with power only from the external power source, and the group B may be supplied with power from both the external power source and the dye-sensitized solar cell 300.

As further another example, the group A may be supplied with power only from the dye-sensitized solar cell 300, and the group B may be supplied with power from both the external power source and the dye-sensitized solar cell 300.

Ratios of the group A and the group B may vary depending on the power conversion efficiency of the dye-sensitized solar cell 300. In addition, in the case an LED element 120 is capable of being supplied with power from both the external power source and the dye-sensitized solar cell 300, a power source regulator for regulating voltage and current of the power before the power is supplied is preferably provided at the LED luminaire 10.

In the case the power generated from the dye-sensitized solar cell 300 is used by the LED element 120, an amount of external power used may be reduced, which decreases costs of electric energy or the like. Further, green-house gas such as $CO_2$ generated due to the use of energy is less discharged, which realizes an environment-friendly LED luminaire.

A surface of the substrate 110 opposite to a mounting surface of the LED element 120 comes into contact with the case bottom plate 210. If the bottom plate 210 makes contact with the substrate 110 as described above, the heat generated by light emitted by the light emitting unit 100 is transferred to the case 200, and the entire case 200 may be used as a heat diffusion body.

Moreover, a heat diffusion fin 500 is formed at the upper surface of the bottom plate 210. If the heat diffusion fin 500 is formed, the bottom plate 210 makes contact with the air in a larger area, which ensures more excellent heat dissipation effect. The heat diffusion fin 500 may have any shape as long as it may increase a contact area with the air, without being limited to FIG. 1. In addition, the heat diffusion fin 500 may also be formed at the side plate 220 instead of the upper surface of the bottom plate 210, and the heat diffusion fin 500 may also be formed at both the bottom plate 210 and the side plate 220.

In order to enhance heat dissipation efficiency, a heat diffusion hole 260 is preferably formed at the case 200. Referring to FIGS. 1 and 2, the heat diffusion hole 260 may be formed at the top plate 230 or the side plate 220 and have a slit shape elongated in a horizontal or vertical direction. In addition, the heat diffusion hole 260 may have various shapes which help heat dissipation.

The dye-sensitized solar cell 300 is installed below the light emitting unit 100 and passes the light irradiated from the light emitting unit 100. Referring to FIGS. 1 and 2, the dye-sensitized solar cell 300 is installed at a lower end of the side plate 220 and also installed in parallel to the substrate 110 to be spaced apart from the light emitting unit 100 including the substrate 110 and the LED element 120 by a predetermined distance.

Since light is irradiated downwards from the LED element 120, the dye-sensitized solar cell 300 is placed on a plane perpendicular to the direction in which the light is irradiated. Even though FIGS. 1 and 2 show that the lower end of the side plate 220 makes contact with the upper surface of the dye-sensitized solar cell 300, the lower portion of the inner side of the side plate 220 may make contact with the side of the dye-sensitized solar cell 300, or the solar cell may also be located to be slightly depressed toward the first accommodation portion 240, without being limited to the above.

In the case the light source of the luminaire is a point light source, directly looking at the point light source may cause blinding. Therefore, the diffusion plate plays a role of a structure which converts the point light source into a surface light source. In the first embodiment, the dye-sensitized solar cell 300 serves as the diffusion plate which diffuses the light emitted from the light emitting unit 100. The dye-sensitized solar cell 300 may pass light since it is transparent. In addition since the dye-sensitized solar cell 300 generally has a brown-based color, it may be used as a diffusion plate.

It is not mandatory for the dye-sensitized solar cell 300 to be spaced apart from the light emitting unit 100 by a predetermined distance and installed in parallel to the substrate 110. However, in order to fully carry out a role of the diffusion plate, the dye-sensitized solar cell 300 is preferably spaced apart from the light emitting unit 100. The distance may vary depending on the intensity of the light emitting unit 100. The dye-sensitized solar cell 300 passes the light emitted from the light emitting unit 100 and diffuses the light. In addition, the dye-sensitized solar cell 300 is generally parallel to the substrate 110.

In the first embodiment, the dye-sensitized solar cell 300 plays not only a role of a diffusion plate but also its inherent role. Therefore, the light incident to the dye-sensitized solar cell 300 other than light emitted to the outside through the dye-sensitized solar cell 300 is used for generating power at the dye-sensitized solar cell 300. The power generated at the dye-sensitized solar cell 300 is used for driving the fan 600. A wire is connected to an electrode (not shown) formed at the dye-sensitized solar cell 300, and this wire is connected to the fan 600, thereby electrically connecting the dye-sensitized solar cell 300 to the fan 600.

Referring to FIG. 1, the fan 600 is formed in the second accommodation portion 250. In more detail, the fan 600 is oriented toward the heat diffusion fin 500 and installed at the lower surface of the top plate 230. However, since the location of the heat diffusion fin 500 may be changed as described above, the fan 600 may be located at any position suitable for blowing wind to the heat diffusion fin 500. For example, the fan 600 may be installed at the inner side surface of the side plate 220. In other cases, it is also possible that a driving unit for driving the fan 600 is installed out of the case 200 and only blades of the fan 600 are located inside the case 200. The air heated while passing through the heat diffusion fin 500 or the like is discharged out of the LED luminaire 10 through the heat diffusion hole 260 by the fan 600.

A power source controller (not shown) for driving the LED element 120 may be designed to be integrated with the substrate 110. In other cases, the power source controller may be located in the first accommodation portion 240 or the second accommodation portion 250 or installed out of the case 200. However, since heat is generated not only from the LED element 120 but also from the power source controller, the power source controller is preferably disposed at a location easily cooled by the fan 600.

A storage battery 700 for storing power generated by the dye-sensitized solar cell 300 is not provided. However, in the first embodiment, since the power generated by the dye-sensitized solar cell 300 is directly used for the fan 600, the storage battery is not needed. In this case, since the relatively expensive storage battery 700 is not necessary, the production cost of the LED luminaire 10 may be lowered.

Second Embodiment

Figure 3:
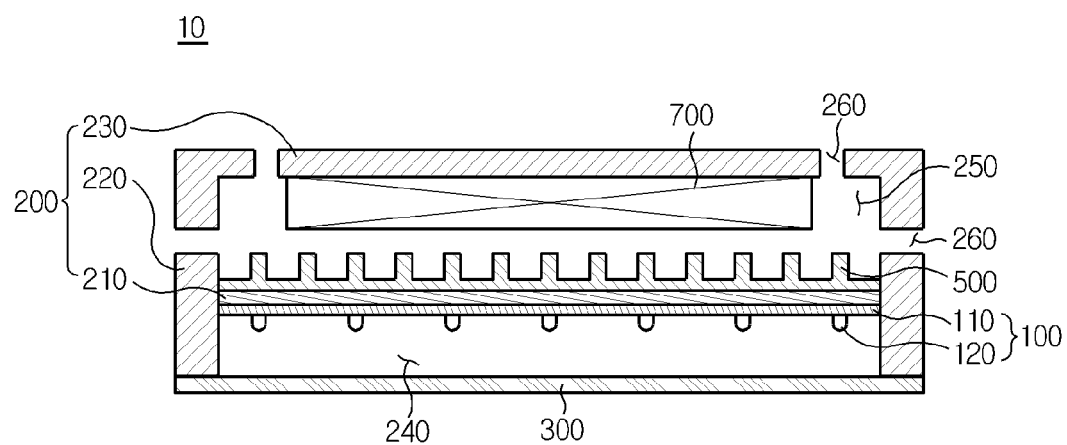
FIG. 3 is a cross-sectional view showing an LED luminaire according to a second embodiment of the present disclosure.

FIG. 3 is a cross-sectional view showing an LED luminaire 10 according to a second embodiment of the present disclosure. Although the first embodiment includes the fan 600, the second embodiment does not include the fan but includes a storage battery 700. If the storage battery 700 is provided, there are disadvantages in that the production cost of the LED luminaire 10 increases. However, the advantage is that the power generated by the dye-sensitized solar cell 300 may be used at any time as desired. Except for the above, the configuration of the second embodiment is substantially identical to that of the first embodiment.

It is also possible to combine the LED luminaire 10 of the first embodiment and the LED luminaire 10 of the second embodiment. In this case, since the storage battery 700 and the fan 600 are provided together, it is not necessary to instantly use the power generated by the dye-sensitized solar cell 300 for the fan 600. Therefore, the fan 600 may be operated at any time as desired. For example, it is also possible that the power is stored and then used for driving the fan 600 during a certain time if the temperature of the substrate 110 or the heat diffusion fin 500 reaches a predetermined level to cool the substrate 110 or the heat diffusion fin 500.

Heretofore, a rectangular luminaire installed at the ceiling or the like has been described in the first and second embodiments. However, the present disclosure described based on the embodiments may be identically applied to a circular luminaire or a desk lamp, without being limited to the above. It would be fully understood that the technical spirit of the present disclosure lies in the arrangement and function of the dye-sensitized solar cell 300 and the utilization of power generated by the dye-sensitized solar cell 300, not in structures of the case 200, the substrate 110, the heat diffusion fin 500 or the like.

In addition, even though the present disclosure has been described based on embodiments, it should be understood that the detailed description and specific examples, while indicating preferred embodiments of the disclosure, are given by way of illustration only, since various changes and modifications within the spirit and scope of the disclosure will become apparent to those skilled in the art from this detailed description. In addition, such changes and modifications should be interpreted as being included in the range of the present disclosure defined in the appended claims.

What is claimed is:

1. A light emitting diode (LED) luminaire, comprising: a case having an accommodation portion and an opening for communicating the accommodation portion with an outside, and a second accommodation portion spaced apart from the accommodation portion; a light emitting unit disposed in the accommodation portion and having at least one LED; a dye-sensitized solar cell disposed at the opening and adapted to diffuse a first part of a light irradiated from the light emitting unit and absorb a second part of the light irradiated from the light emitting unit, wherein the first part of the light is emitted to the outside; and a fan driven by a current generated from the dye-sensitized solar cell, wherein the fan is disposed within the second accommodation portion, and wherein the fan is adapted to remove heat generated by the operation of the light emitting unit.

2. The LED luminaire according to claim 1, wherein the light emitting unit is driven by any one of powers applied from an external power source and the dye-sensitized solar cell.

3. The LED luminaire according to claim 1, further comprising a storage battery adapted to store a power generated by the dye-sensitized solar cell.

4. The LED luminaire according to claim 3, wherein the fan is electrically coupled to the storage battery.

5. The LED luminaire according to claim 1, further comprising a heat diffusion fin extending from the case.

6. The LED luminaire according to claim 1, wherein the case further comprises a heat diffusion hole extending through a portion of the case.

7. The LED luminaire according to claim 1, wherein the dye-sensitized solar cell is disposed relative to the light emitting unit such that a light irradiated from the light emitting unit passes directly from the light emitting unit to the dye-sensitized solar cell.

8. An LED luminaire comprising: a case having a first surface and a plurality of side surfaces extending from the first surface, the case defining an accommodation portion in open communication with an outside, and a second accommodation portion spaced apart from the accommodation portion; a dye-sensitized solar cell coupled to at least one of the side surfaces at a location opposite the first surface; a light emitting unit disposed in the accommodation portion of the case between the first surface and the dye-sensitized solar cell, the light emitting unit having at least one LED; and a fan driven by a current generated from the dye-sensitized solar cell, wherein the fan is disposed in the second accommodation portion, and wherein the fan is adapted to remove heat generated by operation of the light emitting unit.

9. The LED luminaire according to claim 8, wherein the dye-sensitized solar cell is disposed relative to the light emitting unit such that a light irradiated from the light emitting unit is adapted to pass directly from the light emitting unit to the dye-sensitized solar cell.

10. The LED luminaire according to claim 8, wherein the light emitting unit is driven by any one of powers applied from an external power source and the dye-sensitized solar cell.

11. The LED luminaire according to claim 8, further comprising a heat diffusion fin extending from the case.

12. The LED luminaire according to claim 8, further comprising a storage battery adapted to store a power generated by the dye-sensitized solar cell.

13. The LED luminaire according to claim 12, wherein the fan is electrically coupled to the storage battery.

14. The LED luminaire according to claim 8, wherein the dye-sensitized solar cell is adapted to diffuse a first part of a light irradiated from the light emitting unit to be emitted to the outside and absorb a second part of the light irradiated from the light emitting unit.

15. An LED luminaire comprising: a case defining an accommodation portion in communication with an outside, and a second accommodation portion spaced apart from the accommodation portion; a dye-sensitized solar cell coupled to the case; a light emitting unit disposed within the accommodation portion of the case; and at least one of a fan and a battery disposed in the second accommodation portion, wherein the dye-sensitized solar cell is adapted to diffuse a first part of a light irradiated from the light emitting unit and absorb a second part of the light irradiated from the light emitting unit, and wherein the first part of the light irradiated from the light emitting unit is adapted to be emitted to the outside.

16. The LED luminaire according to claim 15, wherein the dye-sensitized solar cell is disposed relative to the light emitting unit such that a light irradiated from the light emitting unit is adapted to pass directly from the light emitting unit to the dye-sensitized solar cell.

17. The LED luminaire according to claim 15, further comprising a heat diffusion fin extending from the case.

18. The LED luminaire according to claim 15, wherein the light emitting unit is driven by any one of powers applied from an external power source and the dye-sensitized solar cell.

* * * * *